(12) United States Patent
Watanabe et al.

(10) Patent No.: US 7,197,108 B2
(45) Date of Patent: *Mar. 27, 2007

(54) METHOD OF FABRICATING X-RAY MASK AND METHOD OF FABRICATING SEMICONDUCTOR DEVICE USING THE X-RAY MASK

(75) Inventors: Hiroshi Watanabe, Hyogo (JP); Koji Kise, Hyogo (JP); Kenji Itoga, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 357 days.

This patent is subject to a terminal disclaimer.

(21) Appl. No.: 10/627,611

(22) Filed: Jul. 28, 2003

(65) Prior Publication Data

US 2005/0074676 A1    Apr. 7, 2005

(30) Foreign Application Priority Data

Mar. 10, 2003    (JP) .............................. 2003-062939

(51) Int. Cl.
*G21K 5/00*    (2006.01)
(52) U.S. Cl. ............................................ 378/35; 430/5
(58) Field of Classification Search .................. 378/35, 378/34; 430/5
See application file for complete search history.

(56) References Cited

U.S. PATENT DOCUMENTS

| | | | |
|---|---|---|---|
| 4,855,197 A * | 8/1989 | Zapka et al. .................... | 430/5 |
| 5,005,075 A * | 4/1991 | Kobayashi et al. ............ | 378/35 |
| 5,414,746 A * | 5/1995 | Deguchi et al. ............... | 378/35 |
| 5,553,110 A * | 9/1996 | Sentoku et al. ................ | 378/35 |
| 5,770,335 A | 6/1998 | Miyake et al. | |
| 5,870,448 A * | 2/1999 | Maehara et al. ............... | 378/35 |
| 6,534,221 B2 * | 3/2003 | Lee et al. ........................ | 430/5 |
| 6,810,104 B2 * | 10/2004 | Morales ......................... | 378/35 |
| 6,898,267 B2 * | 5/2005 | Watanabe et al. .............. | 378/35 |
| 2001/0021239 A1* | 9/2001 | Itoga et al. .................... | 378/35 |

FOREIGN PATENT DOCUMENTS

JP    09-043829    2/1997

OTHER PUBLICATIONS

Computer translation of JP 09-043829.*
K. Fujii et al, "Optimum Phase Condition for Low-Contrast X-Ray Masks", *Jpn. J. Appl. Phys.*, Dec. 1999, pp. 7076-7079, vol. 38 Part 1 No. 12B.

* cited by examiner

*Primary Examiner*—Edward J. Glick
*Assistant Examiner*—Chih-Cheng Glen Kao
(74) *Attorney, Agent, or Firm*—Leydig, Voit & Mayer, Ltd.

(57) ABSTRACT

In fabricating an X-ray mask, a chromium oxide film serving as an etching stopper is formed on a diamond film serving as an X-ray transmitter. Then, a diamond layer serving as a first X-ray absorber is formed on the chromium oxide film. Thereafter, a tungsten layer serving as a second X-ray absorber is formed on the diamond layer. Consequently, the diamond layer and the tungsten layer form an X-ray absorber having a laminated structure. When the X-ray absorber has a laminated structure including substances having different compositions, the transmittance and the phase shift quantity of the overall X-ray absorber can be readily adjusted. Thus, a method of fabricating an X-ray mask providing improved resolution of the pattern of a semiconductor device or the like is obtained.

18 Claims, 12 Drawing Sheets

METHOD OF FABRICATING X-RAY MASK AND METHOD OF FABRICATING SEMICONDUCTOR DEVICE USING THE X-RAY MASK

BACKGROUND OF THE INVENTION

1. Field of the Invention

The present invention relates to a method of fabricating an X-ray mask and a method of fabricating a semiconductor device with an X-ray mask fabricated by this method.

2. Description of the Background Art

In proximity X-ray exposure, an X-ray mask and a wafer formed with a resist film are arranged in proximity to each other, for executing X-ray irradiation. In this case, the X-ray mask is prepared from a membrane mask having an X-ray absorber pattern formed on an X-ray transmitter. The wafer is irradiated with X-rays through this membrane mask. Thus, an optical image is formed on the resist film with the X-rays transmitted through the X-ray transmitter portion of the membrane mask.

At this time, atoms forming the resist film absorb the X-rays. Thus, the resist film generates secondary electrons, thereby causing chemical change on molecules forming the resist film. A latent image of a pattern corresponding to the pattern of the X-ray transmitter portion of the membrane mask is formed on the resist film due to the chemical change.

Thereafter the resist film is developed by removing either the latent image portion or a portion other than the latent image portion. Thus, the pattern of the X-ray absorber portion of the membrane mask is transferred to the resist film.

The resolution R of the pattern formed on the resist film decided by the optical image is expressed as follows:

$$R = k\sqrt{(\lambda \times G)}$$

where k represents a constant depending on the resist process or the like, $\lambda$ represents the exposure wavelength, and G represents the distance between the surface of the X-ray mask and the surface of the resist film formed on the wafer. The distance G is hereinafter referred to as a mask-to-resist interval.

When a membrane mask having a mask-to-resist interval G of 10 μm is employed, exposure is currently performed with light having an exposure wavelength $\lambda$ in the range of 0.7 nm to 1.2 nm. If the pattern formed on the membrane mask to be transferred to the resist film is about 60 nm, the resolution R of the transferred pattern satisfies a prescribed criterion. In order to further improve the resolution R, the exposure wavelength $\lambda$ or the mask-to-resist interval G may be reduced.

If the mask-to-resist interval G is reduced, however, the X-ray mask and the resist film disadvantageously come into contact with each other, to increase the danger of breakage of the X-ray mask. Further, the mask-to-resist interval G cannot be extremely reduced due to a setting error included therein.

If the exposure wavelength $\lambda$ is reduced, the energy of secondary electrons generated in the resist film due to X-ray irradiation is increased to disadvantageously reduce the resolution R.

A method of improving the resolution R of a pattern with a conventional X-ray mask under prescribed conditions of an exposure wavelength $\lambda$ and a mask-to-resist interval G is now described.

A principle of forming an optical image with an X-ray phase-shift mask improving resolution R without changing an exposure wavelength $\lambda$ and a mask-to-resist interval G is described with reference to FIG. 1. This principle is described in Jpn. J. Appl. Phys., Vol. 38 (1999) pp. 7076–7079 by K. Fujii, K. Suzuki and Y. Matsui, December, 1999.

FIG. 1 is a diagram for illustrating the effect of an X-ray phase-shift mask 1 having a line-and-space pattern (hereinafter referred to as "L & S pattern") formed by alternately arranging openings provided with no X-ray absorbers and shielding portions provided with X-ray absorbers.

In the X-ray phase-shift mask 1, X-ray absorbers 2 are provided beneath an X-ray transmitter 3, as shown in FIG. 1. In general, X-rays are substantially absorbed by the X-ray absorbers 2 and substantially transmitted through the X-ray transmitter 3. Therefore, consider X-ray intensity levels on a point P of a resist film located immediately under an opening between a pair of adjacent X-ray absorbers 2 and a point Q of the resist film located immediately under a shielding portion consisting of one of the X-ray absorbers 2.

FIG. 1 illustrates optical images formed by X-rays transmitted through the openings with solid lines and those formed by X-rays transmitted through the shielding portions with dotted lines. As understood from FIG. 1, the X-rays transmitted through the openings form optical images not only immediately under the openings but also immediately under the shielding portions. Therefore, the resolution R of the X-ray phase-shift mask 1 is reduced.

In practice, however, the X-rays transmitted through the openings and those transmitted through the shielding portions are superposed with each other to form the optical images. In order to improve the optical image contrast, therefore, the X-ray phase shift-mask 1 must be so formed that the X-rays transmitted through the openings and the shielding portions respectively strengthen the optical images at the point P and weaken the optical images at the point Q.

Conditions for improving the optical image contrast are now described. It is assumed that φabs denotes the phase shift quantity of X-rays transmitted through the X-ray absorbers 2 and φgeo denotes geometric phase difference of X-rays resulting from difference between optical paths D→P and C→P. In this case, X-rays (B→D→P) transmitted through the openings and X-rays (A→C→P) transmitted through the shielding portions strengthen each other under the following condition:

$$\phi geo + \phi abs = 0 \qquad (1)$$

At the point Q, X-rays (B→D→Q) transmitted through the openings and X-rays (A→C→Q) transmitted through the shielding portions weaken each other under the following condition:

$$\phi geo - \phi abs = \pi \qquad (2)$$

Therefore, the optimum phase condition corresponding to both conditions of the expressions (1) and (2) is expressed as follows:

$$\lambda geo = -\phi abs = 0.5\pi$$

The optical image contrast is defined as (Ip−Iq)/(Ip+Iq), where Ip represents the intensity of X-rays on portions of the resist film located immediately under the openings, and Iq represents intensity of X-rays on portions of the resist film located immediately under the shielding portions.

It is assumed that X-ray intensity at the point P resulting from X-rays transmitted through the openings is 1, and X-ray intensity at the point Q resulting from X-rays transmitted through the openings is expressed as a. The X-ray intensity at the point P resulting from X-rays transmitted through the shielding portions is 1/MC times the X-ray intensity at the point P resulting from X-rays transmitted through the openings.

Therefore, X-ray intensity at the point Q resulting from the X-rays transmitted through the shielding portions is expressed as a/MC, where MC represents the mask contrast corresponding to the inverse number of the transmittance of the X-ray absorbers 2.

Under the aforementioned conditions, the optical image contrast in the optimum phase condition is expressed as follows:

$$((1+2a/MC)-|1/MC-2a|)/((1+2a/MC)+|1/MC-2a|))$$

Further, the optical image contrast reaches the maximum value 1 when 2a=1/MC, which is the condition for obtaining an ideal optical image.

The aforementioned prior art Jpn. J. Appl. Phys., Vol. 38 (1999) by K. Fujii, K. Suzuki and Y. Matsui describes the following:

Consider a case of an exposure wavelength λ of 0.78 nm, a mask-to-resist interval G of 12 μm and mask contrast MC of 2.5, for example. In this case, the phase shift quantity $\phi$abs reaches 0.54π in an X-ray mask employing tantalum (Ta) films of 290 nm in thickness as X-ray absorbers 2 in an L & S pattern having a pitch of 70 nm.

Consider a case of an exposure wavelength λ of 0.78 nm, a mask-to-resist interval G of 7 μm and mask contrast MC of 2. In this case, the phase shift quantity $\phi$abs reaches 0.57π in an X-ray mask employing molybdenum (Mo) films of 370 nm in thickness as X-ray absorbers 2 in an L & S pattern having a pitch of 50 nm.

Problems related to an X-ray mask implementing the aforementioned optimum phase condition are described. The prior art describes an X-ray phase-shift mask 1 employing X-ray absorbers 2 having mask contrast MC of either 2 or 2.5 satisfying the optimum phase condition. This prior art further describes that the resolution R can be improved with respect to different mask-to-resist intervals G without changing the exposure wavelength λ.

In order to improve the resolution R, it is also effective to reduce the exposure wavelength λ, as hereinabove described. However, the aforementioned prior art describes no method of improving the resolution R by reducing the exposure wavelength λ without changing the mask-to-resist interval G in order to avoid a risk such as breakage of the mask.

In-practice, tungsten and tantalum generally employed as the materials for the X-ray absorbers 2 have absorption edges, i.e., boundaries of wavelengths capable of absorbing X-rays, of 0.69 nm and 0.73 nm respectively. In order to satisfy the condition $\phi$abs =−0.5π, therefore, the mask contrast MC must be increased also as to a wavelength slightly shorter than that of an X-ray absorption edge. Consequently, no X-rays are transmitted through the X-ray absorbers 2. Thus, the degree of contribution of the phase shift effect is reduced, to reduce the optical image contrast.

When the mask contrast MC is about 2 to 3 similarly to a general one, it follows that the phase shift quantity $\phi$abs of the X-ray absorbers 2 approaches zero from −0.5π. In this case, the optimum phase condition cannot be implemented. When a pattern is transferred with a wider mask-to-resist interval G which the geometric phase difference $\phi$geo does not satisfy the optimum phase condition, the resolution R of the pattern is deteriorated.

In the conventional X-ray mask, the optical image contrast reaches the maximum value 1 when 2a=1/MC. However, the value a is decided by the size of the pattern formed on the X-ray mask, the exposure wavelength λ of X-rays and the mask-to-resist interval G.

In practice, the ideal state of the optical image contrast 1 cannot be implemented unless the mask contrast MC satisfies 2a=1/MC after the size of the pattern formed on the X-ray mask, the exposure wavelength λ of X-rays and the mask-to-resist interval G are decided.

When X-ray absorbers 2 constituted of a single substance are employed as in the prior art, the phase shift quantity $\phi$abs and the mask contrast MC are unequivocally decided. Therefore, the mask contrast MC does not necessarily satisfy the condition 2a=1/MC.

While various X-ray masks have been developed in order to solve the aforementioned problems, there has been developed no X-ray mask capable of further improving the resolution of a pattern of a semiconductor device formed with the X-ray mask.

SUMMARY OF THE INVENTION

An object of the present invention is to provide a method of fabricating an X-ray mask capable of improving the resolution of a pattern of a semiconductor device and a method of fabricating a semiconductor device with an X-ray mask fabricated by the method.

A method of fabricating an X-ray mask according to a first aspect of the present invention comprises steps of forming an X-ray transmitter and forming a laminated (stacked) X-ray absorber on the X-ray transmitter. According to this method, at least two types of layers having different compositions are employed for the laminated X-ray absorber.

According to the aforementioned method of fabricating an X-ray mask, it is possible to fabricate an X-ray mask having a prescribed function, which has not been implementable with an X-ray absorber consisting of a layer of a single composition, by adjusting at least either the transmittances or the phase shift quantities of at least two types of layers having different compositions.

A method of fabricating an X-ray mask according to a second aspect of the present invention comprises steps of forming a dug portion and a portion other than the dug portion on an X-ray transmitter and forming an X-ray absorber on the portion other than the dug portion.

According to the aforementioned method of fabricating an X-ray mask, it is possible to fabricate an X-ray mask having a prescribed function, which has not been implementable by simply forming a single X-ray absorber, by adjusting at least either the transmittances or the phase shift quantities of the portion other than the dug portion and the X-ray absorber.

A method of fabricating a semiconductor device of the present invention carries out an exposure step with an X-ray mask on condition that geometric X-ray phase difference between the phase of X-rays transmitted through an X-ray transmission part of the X-ray mask and the phase of X-rays transmitted through an X-ray absorber of the X-ray mask is in the range including 0.57π and in proximity to 0.57π between a resist film located on a position for forming an optical image with the X-rays and the X-ray mask. The X-ray mask comprises an X-ray transmitter and the X-ray absorber consisting of a laminated structure having at least two layers formed on the X-ray transmitter. The laminated structure includes at least two layers having different compositions. At least either a condition that the phase shift quantity of the X-rays transmitted through the X-ray absorber is in the range of 0.37π to 0.6π or a condition that the transmittance of the X-rays transmitted through the X-ray absorber is in the range of 30% to 60% holds.

According to the aforementioned structure, a pattern can be transferred from the X-ray mask to the resist film with high optical image contrast, whereby the accuracy of the pattern formed on the semiconductor device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 11:
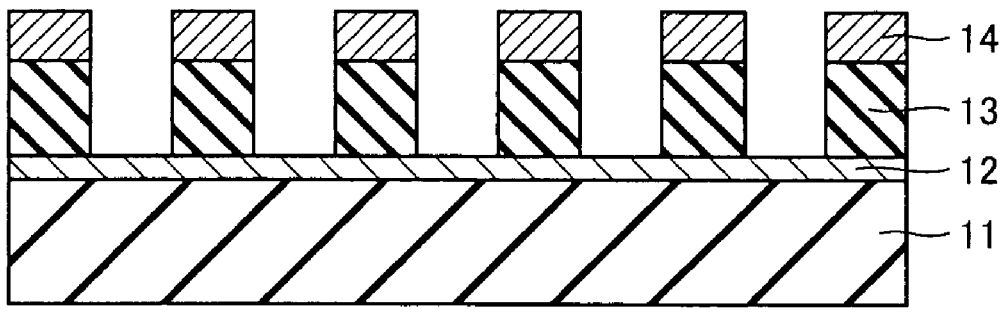
FIG. 11 is a model diagram showing an X-ray mask according to a second embodiment of the present invention.

An X-ray mask obtained by a method of fabricating an X-ray mask according to a first embodiment of the present invention and an exemplary method of fabricating a semiconductor device with the X-ray mask are now described. In an exemplary X-ray mask fabricated according to the first embodiment, each of X-ray absorbers formed on an X-ray transmitter includes at least two layers having different element structural ratios, as shown in FIG. 11. The phase shift quantity of X-rays transmitted through the X-ray absorbers is in the range of $0.3\pi$ to $0.6\pi$, and the transmittance of the X-rays transmitted through the X-ray absorbers is in the range of 30% to 60%.

An exemplary method of fabricating a semiconductor device with the X-ray mask carries out two steps, i.e., a first step of calculating geometric X-ray phase difference between the phase of X-rays transmitted through X-tray transmission parts and the phase of X-rays transmitted through the X-ray absorbers of the X-ray mask between a resist film located on a position for forming an optical image with the X-rays and the X-ray mask and a second step of calculating the phase shift quantity of the X-rays transmitted through the X-ray absorbers.

When the average exposure wavelength of X-rays absorbed by the resist film is larger than 0.3 nm and smaller than 0.7 nm, the X-ray mask according to this embodiment is preferably employed on condition that the geometric phase difference of X-rays is in the range including $0.5\pi$ and in proximity to $0.5\pi$.

When the average exposure wavelength of X-rays absorbed by the resist film is larger than 0.3 nm and smaller than 0.7 nm, further, the X-ray mask according to this embodiment may be employed on condition that the absolute value of difference between the geometric phase difference and the phase shift quantity of the X-rays transmitted through the X-ray absorbers is in the range including c and in proximity to n.

In the aforementioned method of fabricating an X-ray mask according to this embodiment, each of the X-ray absorbers is formed in a laminated structure of at least two layers having different element structural ratios, whereby both of the transmittance and the phase shift quantity of the X-rays transmitted through the X-ray absorbers can be properly adjusted.

Thus, it is possible to fabricate an X-ray mask, which has not been implementable with a conventional method of fabricating an X-ray mask employing an X-ray absorber having a single composition, by the method of fabricating an X-ray mask according to this embodiment. In other words, it is possible to fabricate an X-ray mask attaining high optical image contrast regardless of the values of a mask-to-resist interval G and an exposure wavelength $\lambda$.

A physical principle utilized for thinking out the method of fabricating an X-ray mask according to this embodiment is now described.

The complex refractive index n of a substance 1 is defined as $1-\delta_1+i\beta_1$, where $1-\delta_1$ and $\beta_1$ represent the real part and the imaginary part of the complex number respectively. The substance 1 consists of a single composition.

The transmittance $T_1$ and the phase shift quantity $\phi abs_1$ of an X-ray absorber consisting of a single substance employed in a conventional X-ray mask are expressed as follows:

$$T_1 = \exp(-4\pi\beta_1 t/\lambda)$$

$$\phi abs_1 = -2\pi\delta_1 t/\lambda$$

From the relation $\ln(T_1) = 2\beta_1/(\delta_1 \times \phi abs_1)$, a prescribed relational expression holds between the transmittance $T_1$ and the phase shift quantity $\phi abs_1$ of the substance 1. Therefore, it is impossible to control the transmittance $T_1$ and the phase shift quantity $\phi abs_1$ independently of each other when employing the substance 1 consisting of a single composition.

In the above expressions, t represents the film thickness of the substance 1 and λ represents the exposure wavelength. In other words, the transmittance $T_1$ is reduced if the phase shift quantity $\phi abs_1$ is increased, and the former is increased if the latter is reduced.

Now consider the X-ray mask having the X-ray absorbers each formed by two layers, consisting of a material identical to that for the aforementioned X-ray absorbers and a material different from this material respectively, employed in this embodiment.

With reference to the two layers, it is assumed that $T_{1a}$ and $\phi abs_{1a}$ represent the transmittance and the phase shift quantity of a substance $1a$ respectively, and $1-\delta_2+\beta_2$, $T_2$ and $\phi abs_2$ represent the complex refractive index, the transmittance and the phase shift quantity of a substance 2 respectively. The total transmittance $\phi_{total}$ and the total phase shift quantity $\phi_{total}$ of the two layers are expressed as follows:

$$T_{total} = T_{1a} \times T_2$$

$$\phi_{total} = \phi abs_{1a} \times \phi abs_2$$

The transmittance $T_1$ of the X-ray absorber consisting of a single layer and the total transmittance $T_{total}$ of the two layers are set to the same value, so that the following relation holds:

$$T_1 = T_{total}$$

When only the phase shift quantities are changed, the following relations (3) and (4) hold:

$$\ln(T_{total}) = \ln(T_{1a}) + \ln(T_2) \quad (3)$$
$$= 2\beta_1/\delta_1 \times \phi abs_{1a} + 2\beta_2/\delta_2 \times \phi abs_2$$
$$= 2\beta_1/\delta_1 \times (\phi_{total} - \phi abs_2) + 2\beta_2/\delta_2 \times \phi abs_2$$

It is assumed here that the following relation holds:

$$\phi abs_1 = \phi_{total} - \phi abs_2$$

$$\ln(T_{total}) = \ln(T_1) \quad (4)$$

$$2\beta_1/\delta_1 \times (\phi_{total} - \phi abs_2) + 2\beta_2/\delta_2 \times \phi abs_2 = 2\beta_1/\delta_1 \times \phi abs_1$$

This expression is arranged as follows:

$$\beta_1/\delta_1 \times (\phi_{total} - \phi abs_2) = (\beta_1/\delta_1 - \beta_2/\delta_2) \times \phi abs_2$$

From $\beta_1/\delta_1 > 0$ and $\phi abs_2 < 0$, therefore, the substance 2 may be selected on necessary condition of $\beta_1/\delta_1 > \beta_2/\delta_2$ in order to shift the phase shift quantity toward the minus side, i.e., in order to attain $\phi_{total} < \phi abs_2$.

In order to shift the phase shift quantity toward the plus side, i.e., in order to attain $\phi_{total} > \phi abs_2$, on the other hand, the substance 2 may be selected on necessary condition of $\beta_1/\delta_1 < \beta_2/\delta_2$.

Thus, according to the inventive method of fabricating an X-ray mask, X-ray absorbers each having a laminated structure formed by a plurality of types of substances consisting of different compositions are so employed that it is possible to attain such an effect that the phase shift quantity can be adjusted without changing the transmittance of the X-ray absorbers, which has not been attainable in a conventional X-ray mask employing only a single type of X-ray absorber.

Consider a case of changing only the transmittance while setting the phase shift quantity $\phi abs_1$ of the X-ray mask having the X-ray absorber consisting of a single layer and the phase shift quantity $\phi_{total}$ of the X-ray mask having the X-ray absorbers each consisting of two-layers.

The total transmittance $\ln(T_{total})$ is expressed as follows:

$$\ln(T_{total}) = \ln(T_{1a}) + \ln(T_2)$$
$$= 2\beta_1/\delta_1 \times (\phi_{total} - \phi abs_2) + 2\beta_2/\delta_2 \times \phi abs_2$$
$$= 2\beta_1/\delta_1 \times (\phi abs_1 - \phi abs_2) + 2\beta_2/\delta_2 \times \phi abs_2$$
$$= \ln(T_1) - 2(\beta_1/\delta_1 - \beta_2/\delta_2) \times \phi abs_2$$

From the relation $\phi abs_2 < 0$, therefore, the substance 2 may be selected for forming X-ray absorbers on necessary condition of $\beta_1/\delta_1 > \beta_2/\delta_2$ in order to increase the transmittance so that $\ln(T_{total}) > \ln(T_1)$.

The transmittance is naturally in the range of 0% to 100%, and hence $\ln(T_{1a}) < 0$. In order to satisfy this condition, the phase shift quantity of the substance 2 employed for the X-ray absorbers must satisfy the relation $\phi abs_1 < \phi abs_2$.

In order to reduce the transmittance, on the other hand, the X-ray absorbers may be made of a material satisfying the condition $\beta_1/\delta_1 < \beta_2/\delta_2$ as the substance 2.

Thus, it is possible to implement a combination of a transmittance and a phase shift quantity, which is not implementable in a conventional X-ray absorber consisting of a substance having a single composition, by employing X-ray absorbers each having a laminated or mixed structure consisting of different elements or different composition ratios. Thus, it is possible to attain such an unparalleled remarkable effect that X-ray absorbers having a more proper phase condition or a more proper transmittance with respect to an exposure wavelength are formable.

When the aforementioned principle is applied to the relation between first, second and third substances, it is possible to form X-ray absorbers each having an effect similar to the above with a laminated or mixed structure consisting of substances of three types of substances including the first, second and third substances. Further, X-ray absorbers each having a laminated or mixed structure consisting of substances having at least four types of compositions can also attain an effect similar to the above when the X-ray absorbers are fabricated through a principle similar to the above. When X-ray absorbers each having a mixed structure including a plurality of types of compositions are employed, an X-ray mask exhibits a sectional structure similar to that shown in FIG. 1.

Another phase shift effect not mentioned in the prior art is now described. The prior art shows results obtained on condition that the X-rays mutually strengthen the intensity levels thereof on the surface portions of the resist film located immediately under the openings while weakening the intensity levels thereof on the surface portions of the resist film located immediately under the shielding portions.

When $2a = 1/MC$, however, optical image intensity reaches zero after the X-rays are superposed with each other on the portions located immediately under the shielding portions, and ideal optical image contrast of 1 is obtained if the optical image intensity is plus on the portions located immediately under the openings.

In other words, conditions $2a = 1/MC$ and $\phi geo - \phi abs = \pi$ may be satisfied, and an ideal state is obtained also under a phase condition different from the condition $\phi geo-$ φabs=0.5π described with reference to the prior art. In other words, the ideal state of the optical image contrast of 1 is obtained also at a mask-to-resist interval G different from that satisfying the condition φgeo−φabs=0.5π by satisfying the conditions 2a=1/MC and φgeo−φabs=π with reference to the phase shift quantity and the mask contrast MC of X-ray absorbers. This is also one of principles employed in the present invention.

Thus, it is possible to implement a combination of a transmittance and a phase shift quantity, which is not implementable in an X-ray absorber consisting of a substance having a single composition with respect to each wavelength, by employing X-ray absorbers each having a laminated or mixed structure consisting of different elements.

Consequently, higher optical image contrast than the conventional one can be obtained also when at least either the interval between the X-ray mask and a wafer or the range of the exposure wavelength λ is different from the conventional value. As a result, a semiconductor device having a finer pattern than the conventional one can be formed.

Figure 2:
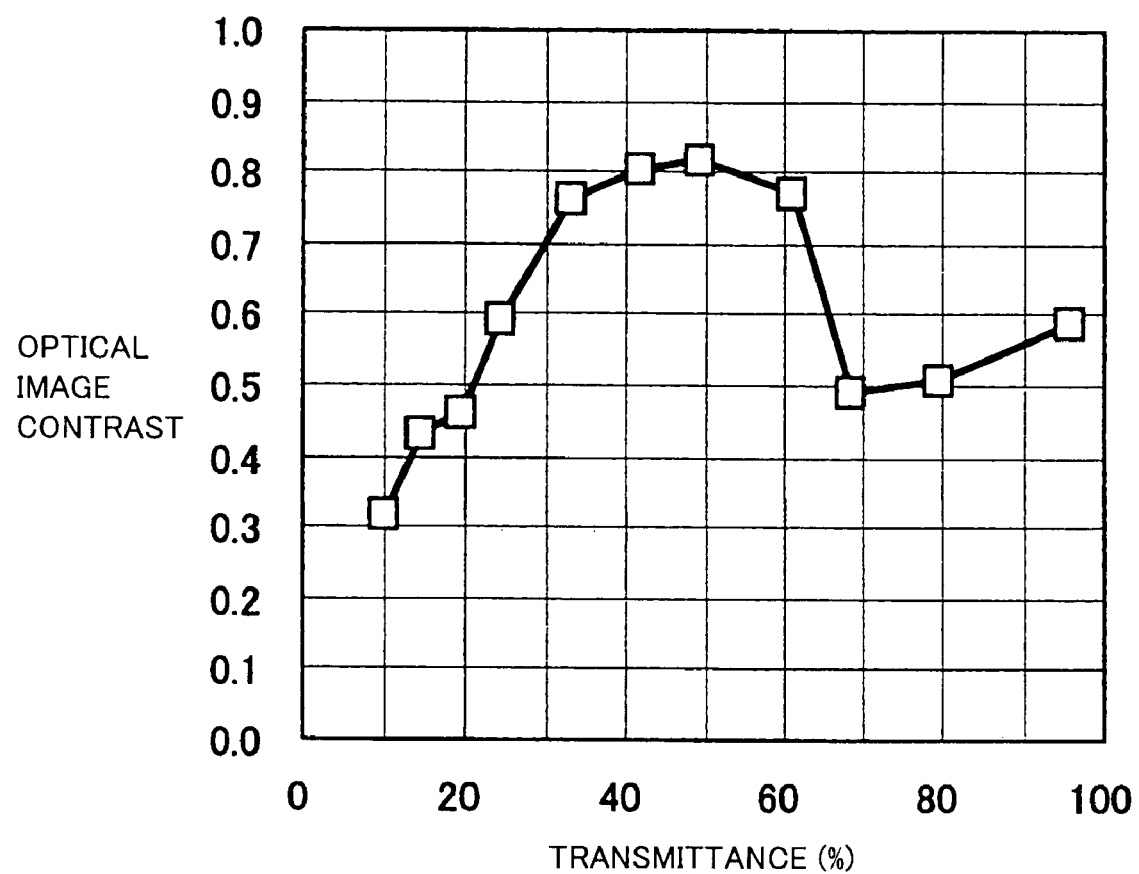
FIG. 2 is a graph showing the relation between the transmittance of an X-ray mask and optical image contrast with reference to a geometric phase difference of $\pi/2$ and a phase shift quantity of $-\pi/2$.

FIG. 2 shows the relation between the contrast of an optical image formed by X-rays on a resist film and the transmittance of X-ray absorbers 2 formed on an X-ray mask in a case of irradiating the resist film with X-rays through the X-ray mask formed with a 35 nm L & S mask pattern. The transmittance corresponds to the inverse number of mask contrast MC.

In this case, the exposure wavelength λ is set to 0.8 nm, and the thickness of and the materials (compositions) for the X-ray absorbers 2 are so selected that the phase shift quantity of the X-ray absorbers 2 reaches −0.5π with respect to this exposure wavelength λ. Further, the mask-to-resist interval G is set to 3.06 μm so that geometric phase difference reaches 0.5π.

As understood from FIG. 2, the optical image contrast depends on the transmittance of the X-ray absorbers 2. The optical image contrast is at the maximum value of 0.82 when the transmittance is substantially 50%, the former is at least 0.7 when the latter is in the range of 30% to 60%, and the former is substantially at least 0.5 when the latter is in the range of 25% to 95%.

In other words, FIG. 2 shows that relatively high optical image contrast of at least 0.7 is obtained in relation to the 35 nm L & S pattern when the mask-to-resist interval G is so set that the geometric phase difference is 0.57π, the phase shift quantity of the X-ray absorbers 2 is −0.5π and the transmittance of the X-ray absorbers 2 is in the range of 30% to 60%.

Thus, the optical image contrast, depending on the transmittance of the X-ray absorbers 2 of the X-ray mask, varies with the transmittance of the X-ray absorbers 2 also when the geometric phase difference and the phase shift quantity of the X-ray absorbers 2 are at optimum values. It is therefore understood that the resolution of the pattern can be improved by properly selecting the transmittance of the X-ray absorbers 2.

Figure 3:
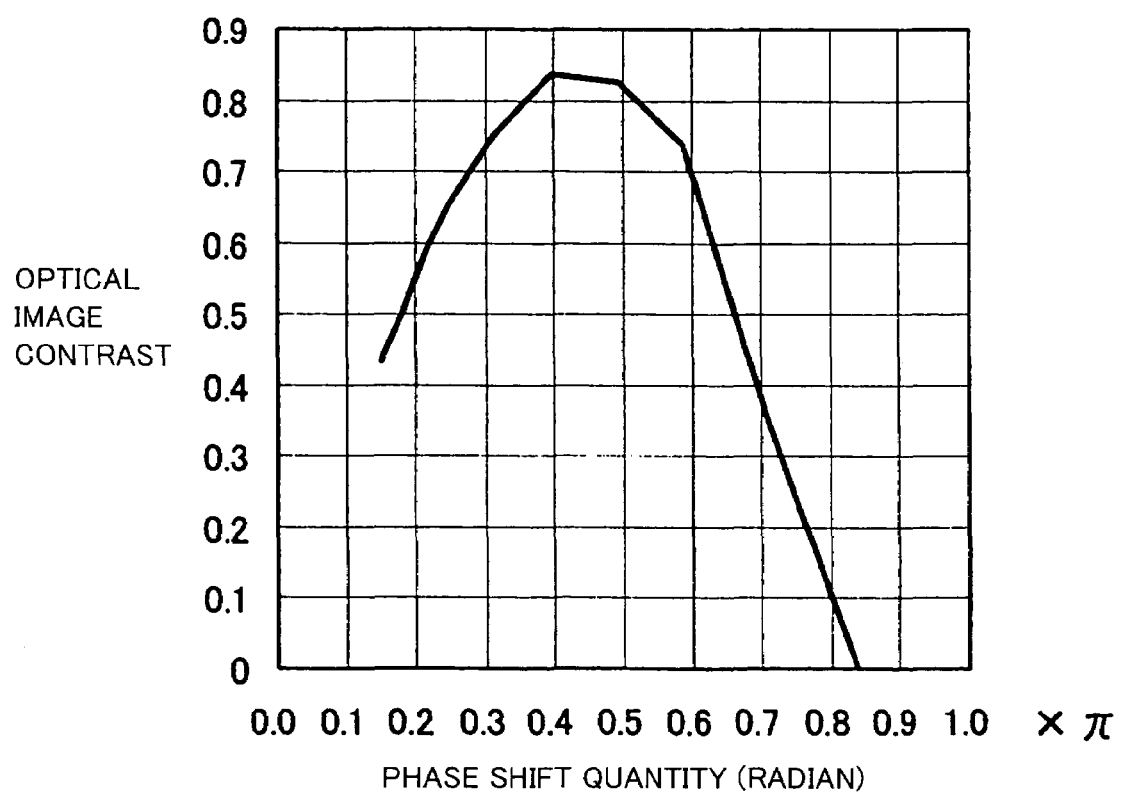
FIG. 3 is a graph showing the relation between a phase shift quantity and optical image contrast.

FIG. 3 shows the relation between the phase shift quantity of the X-ray absorbers 2 and optical image contrast with reference a pattern shape and a pattern size, a mask-to-resist interval G and an exposure wavelength λ selected similarly to those of the L & S pattern described with reference to FIG. 2 and the transmittance of the X-ray absorbers 2 of 50%.

As understood from FIG. 3, the optical image contrast depends on the phase shift quantity of the X-ray absorbers 2. Therefore, the optical image contrast is at least 0.7 when the phase shift quantity is in the range of 0.3π to 0.6π, and the former is at least 0.55 when the latter is in the range of 0.2π to 0.65π.

In other words, relatively high optical image contrast of at least 0.7 is obtained in a 35 nm L & S pattern when the mask-to-resist interval G is so set that the geometric phase difference is 0.57π, the transmittance of the X-ray absorbers 2 is 50% and the phase shift quantity of the X-ray absorbers 2 is in the range of 0.3π to 0.6π.

Figure 4:
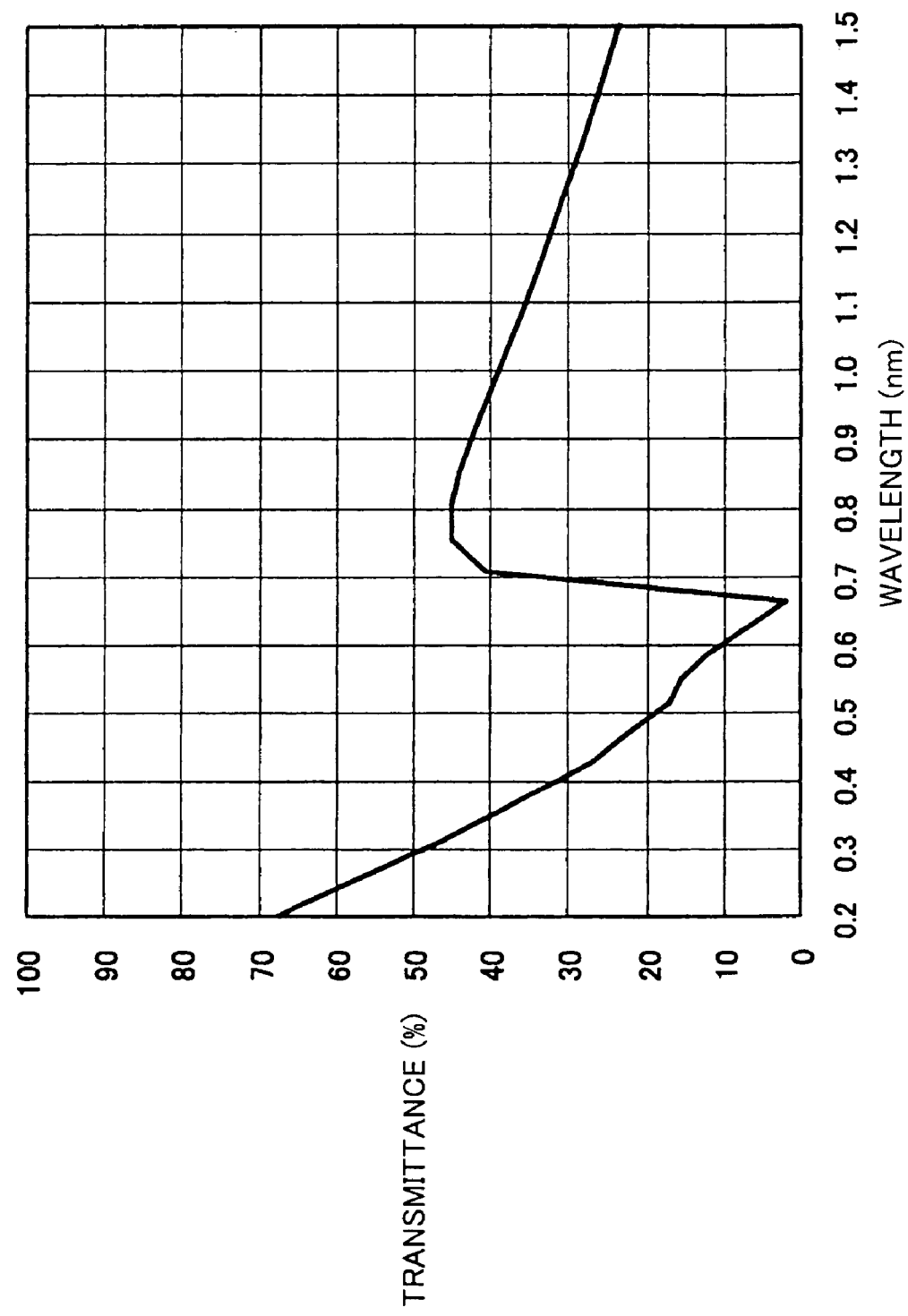
FIG. 4 is a graph showing the relation between an exposure wavelength of X-rays and a transmittance of X-rays with reference to an X-ray absorber, consisting of tungsten, and having a phase shift quantity of $-\pi/2$.

FIG. 4 is a graph plotting the transmittance of a comparative X-ray absorber 2 of tungsten (W) having a phase shift quantity of −0.5π with respect to each wavelength. The transmittance is substantially in the range of 30% to 45% in the comparative X-ray exposure wave range of 0.7 nm to 1.2 nm.

The transmittance is 45% particularly in the wave range proximate to 0.8 nm, and hence it is understood that there is a condition for obtaining high optical image contrast substantially identical to that resulting from the transmittance of 50%.

In order to set the geometric phase difference to 0.5π with respect to a 35 nm L & S pattern, the mask-to-resist interval G must be set to a value proximate to 3 μm. It is difficult to stably implement such a small mask-to-resist interval G, and no 35 nm L & S pattern can be formed.

Consider a method of forming a 35 nm L & S pattern at a mask-to-resist interval G larger than 3 μm by reducing the exposure wavelength λ below 0.7 nm. Tungsten has an absorption edge, corresponding to an end of a wavelength capable of absorbing X-rays, of 0.69 nm.

Therefore, the transmittance of tungsten is remarkably reduced at a wavelength slightly shorter than the absorption edge. At a film thickness for setting a phase shift quantity to −0.5π, therefore, tungsten exhibits a transmittance of not more than 10%. When the exposure wavelength λ is further reduced, the transmittance is gradually increased.

Therefore, the transmittance is not more than 30% when the exposure wavelength λ is in the range of 0.4 nm to 0.68 nm. The transmittance first reaches the optimum value of 50% when the exposure wavelength λ is reduced to 0.3 nm.

Therefore, the comparative X-ray absorber 2 exhibits a relatively low transmittance when the exposure wavelength λ is in the range of 0.4 to 0.68 nm, even if the optimum phase condition is satisfied. It is therefore disadvantageously difficult to improve the resolution also when reducing the exposure wavelength π of the X-ray absorber 2.

In a comparative X-ray mask, the transmittance is less than 50% when the exposure wavelength λ is in the range of 0.3 nm and 1.2 nm and the phase shift quantity is −0.5π. Therefore, the comparative X-ray mask does not necessarily satisfy the optimum phase and transmittance conditions.

The X-ray mask according to this embodiment solves these problems. When each of the X-ray absorbers 2 is in a two-layer structure consisting of different elements or compositions, the transmittance can be increased while keeping the phase shift quantity intact, as already described with reference to the principle of the present invention. The necessary condition therefor is $\beta_1/\delta_1 > \beta_2/\delta_2$. It is naturally necessary to satisfy the condition that the transmittance of each layer is not more than 100%.

When the exposure wavelength λ is 0.4 nm, a tungsten layer having a thickness of about 40 nm and density of 16.2 g/cm³ exhibits a phase shift quantity of −0.5π and a transmittance of about 31%.

Table 1 shows thicknesses and transmittances of layers of tungsten and other materials on condition that the first layers of X-ray absorbers 2 having two-layer structures are prepared from tungsten and second layers thereof are prepared from elements, other than tungsten, having values β/δ smaller than that of tungsten, the total phase shift quantities of the X-ray absorbers 2 are −0.5π and the transmittances thereof are 50%.

TABLE 1

| First Layer | | | Second Layer | | |
|---|---|---|---|---|---|
| Element | Thickness (nm) | Transmittance (%) | Element | Thickness (nm) | Transmittance (%) |
| W | 234 | 50.1 | Li | 4081 | 99.9 |
| W | 233 | 50.2 | Be | 1150 | 99.6 |
| W | 232 | 50.4 | B | 866 | 99.1 |
| W | 229 | 50.8 | C | 547 | 98.4 |
| W | 198 | 55.7 | Na | 2400 | 89.7 |
| W | 183 | 58.2 | Mg | 1396 | 85.9 |
| W | 169 | 60.7 | Al | 989 | 82.4 |
| W | 146 | 64.9 | Si | 1231 | 77.0 |
| W | 109 | 72.5 | P | 1905 | 68.9 |
| W | 63 | 83.1 | S | 1950 | 60.2 |
| W | 217 | 52.6 | K | 2783 | 95.1 |
| W | 216 | 52.8 | Ca | 1468 | 94.6 |
| W | 211 | 53.5 | Sc | 818 | 93.4 |
| W | 209 | 53.9 | Ti | 552 | 92.7 |
| W | 204 | 54.6 | V | 419 | 91.5 |
| W | 202 | 55.1 | Cr | 349 | 90.7 |
| W | 196 | 56.0 | Mn | 351 | 89.2 |
| W | 190 | 57.0 | Fe | 332 | 87.7 |
| W | 184 | 58.1 | Co | 305 | 86.1 |
| W | 176 | 59.5 | Ni | 303 | 84.0 |
| W | 166 | 61.2 | Cu | 328 | 81.7 |
| W | 155 | 63.3 | Zn | 429 | 79.0 |
| W | 143 | 65.5 | Ga | 560 | 76.3 |
| W | 126 | 68.9 | Ge | 668 | 72.5 |
| W | 107 | 73.0 | As | 666 | 68.5 |
| W | 83 | 78.3 | Se | 884 | 63.8 |
| W | 173 | 59.9 | Pd | 346 | 83.5 |
| W | 175 | 59.7 | Ag | 354 | 83.8 |
| W | 177 | 59.2 | Cd | 417 | 84.4 |
| W | 167 | 61.1 | In | 501 | 81.8 |
| W | 161 | 62.1 | Sn | 515 | 80.5 |
| W | 159 | 62.5 | Sb | 556 | 79.9 |
| W | 154 | 63.4 | Te | 628 | 78.8 |
| W | 136 | 66.9 | Cs | 1660 | 74.7 |
| W | 97 | 75.1 | Ba | 1297 | 66.6 |

Lithuim (Li), beryllium (Be), boron (B), carbon (C), sodium (Na), magnesuium (Mg), aluminum (Al), silicon (Si), phosphorus (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), palladium (Pd), silver (Ag), cadmium (Cd), indium (In), tin (Sn), antimony (Sb), tellurium (Te), cesium (Cs) and barium (Ba) can be listed as the materials for the second layers.

Materials including mixtures of the aforementioned elements, carbides such as silicon carbide and tungsten carbide, nitrides such as silicon nitride, aluminum nitride and chromium nitride, oxides such as silicon oxide and chromium oxide, a fluoride and an iodide are preferably employed as the materials for the second layers. In practice, a material having excellent workability is selected from these materials, to be applied to X-ray absorbers.

When any of the aforementioned materials is employed, the thickness of the tungsten layer included in the two-layer structure is reduced as compared with an X-ray absorber consisting of a single layer and hence the tungsten layer, which is hard to work, can be advantageously readily worked.

When any of carbon (C), titanium (Ti), vanadium (V), chromium (Cr), manganese (Mn), iron (Fe), nickel (Ni), copper (Cu), zinc (Zn), gallium (Ga), germanium (Ge), arsenic (As), selenium (Se), palladium (Pd), silver (Ag), cadmium (Cd), indium (In), tin (Sn), antimony (Sb) and tellurium (Te) is employed as the material for the second layer, the thickness of the two-layer structure can be reduced below 1000 nm.

Thus, the thickness of the X-ray absorbers each having a two-layer structure can be relatively reduced, whereby the aspect ratio of the X-ray absorbers can also be relatively reduced. However, workability depends on the working process in addition to the materials, and hence a material having a small film thickness is not necessarily easy to work.

Figure 1:
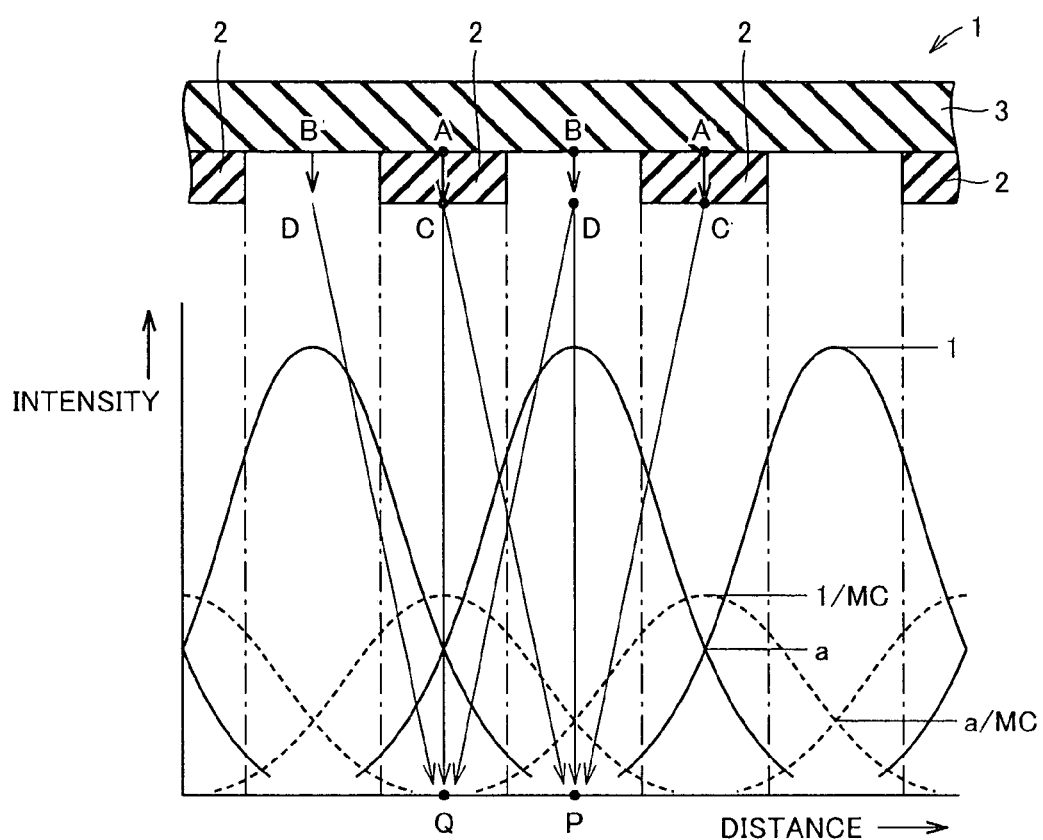
FIG. 1 is a model diagram for illustrating a principle of forming an optical image with an X-ray mask.

The two layers forming each of the X-ray absorbers having a two-layer structure according to this embodiment are formed independently of each other mainly in consideration of workability of the X-ray absorbers. If the first and second layers are simultaneously workable, however, an effect similar to the aforementioned improvement of the optical image contrast can be attained also when single-layer X-ray absorbers, each consisting of a total element structural ratio of the elements forming the first and second layers, such as those shown in FIG. 1 are employed.

Results of calculation of optical image contrast values in 35 nm L & S patterns with reference to various thicknesses of single-layer X-ray absorbers consisting of tungsten and two-layer X-ray absorbers containing tungsten are described with reference to FIGS. 5 to 10.

Light applied to X-ray exposure employed in this embodiment is described. Radiation emitted from a radiation generator having deflection magnetic field strength of 3.5 T and acceleration energy of 0.585 GeV is employed for the X-ray exposure.

This radiation is condensed on a beam line employing two platinum mirrors having an oblique angle of incidence of 1°. The condensed light passes through a beryllium window of 18 μm in thickness serving as a vacuum barrier. The light passing through the beryllium window is applied to a resist film as X-rays.

In an X-ray mask 1, an X-ray transmitter 3 is prepared from diamond, while each of X-ray absorbers 2 has a two-layer structure consisting of a tungsten layer and a diamond layer. Portions provided with the X-ray absorbers 2 and those provided with no X-ray absorber 2 form an L & S pattern having a period of a pitch of 70 nm.

This X-ray mask 1 is employed for transferring the pattern to a resist film with a mask-to-resist interval G of 6 μm. The resist film is prepared from photosensitive resin based on polyhydroxystyrene bromide having a bromine content of 45 percent by weight. Optical image contrast is calculated from an absorbed energy image on the resist film.

In order to investigate an effect attained when reducing the exposure wavelength λ below 0.7 nm, optical image contrast is calculated with reference to various thicknesses, ranging from 2 μm to 100 μm, of a diamond film forming the X-ray transmitter 3. The average exposure wavelength of X-rays absorbed by the resist film is 0.74 nm when the thickness of the diamond film is 2 μm, the former is 0.37 nm when the latter is 100 μm, and the former is about 0.4 nm when the latter is in the range of 60 μm to 80 μm.

The thickness of the diamond film forming the X-ray transmitter 3 is varied for reducing the exposure wavelength λ of X-rays absorbed by the resist film. If the exposure wavelength λ is reducible, another method may alternatively be employed in place of that of varying the thickness of the diamond film.

Figure 5:
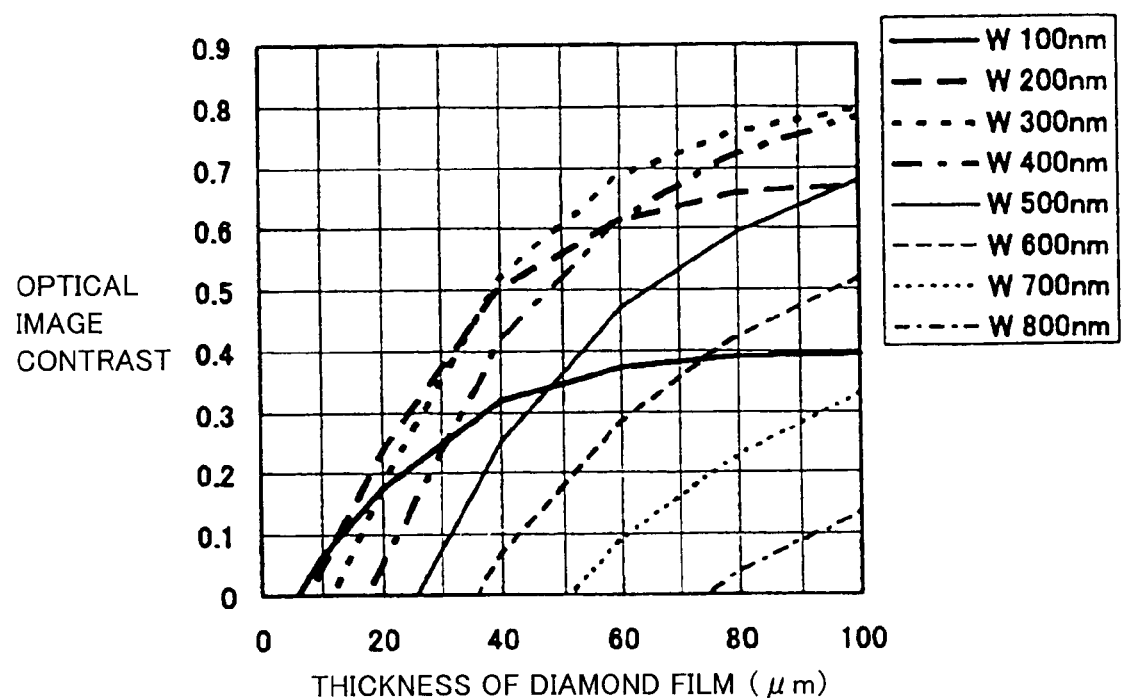
FIG. 5 is a graph showing the relation between the thickness of a diamond films forming an X-ray transmitter and optical image contrast in an X-ray mask according to a comparative example.

FIG. 5 is a graph showing results of calculation obtained when varying the thickness of a tungsten layer forming an X-ray absorber with reference to the relation between optical image contrast in a case of employing the X-ray absorber consisting of a single tungsten layer and the thickness of a diamond film forming an X-ray transmitter.

Figure 6:
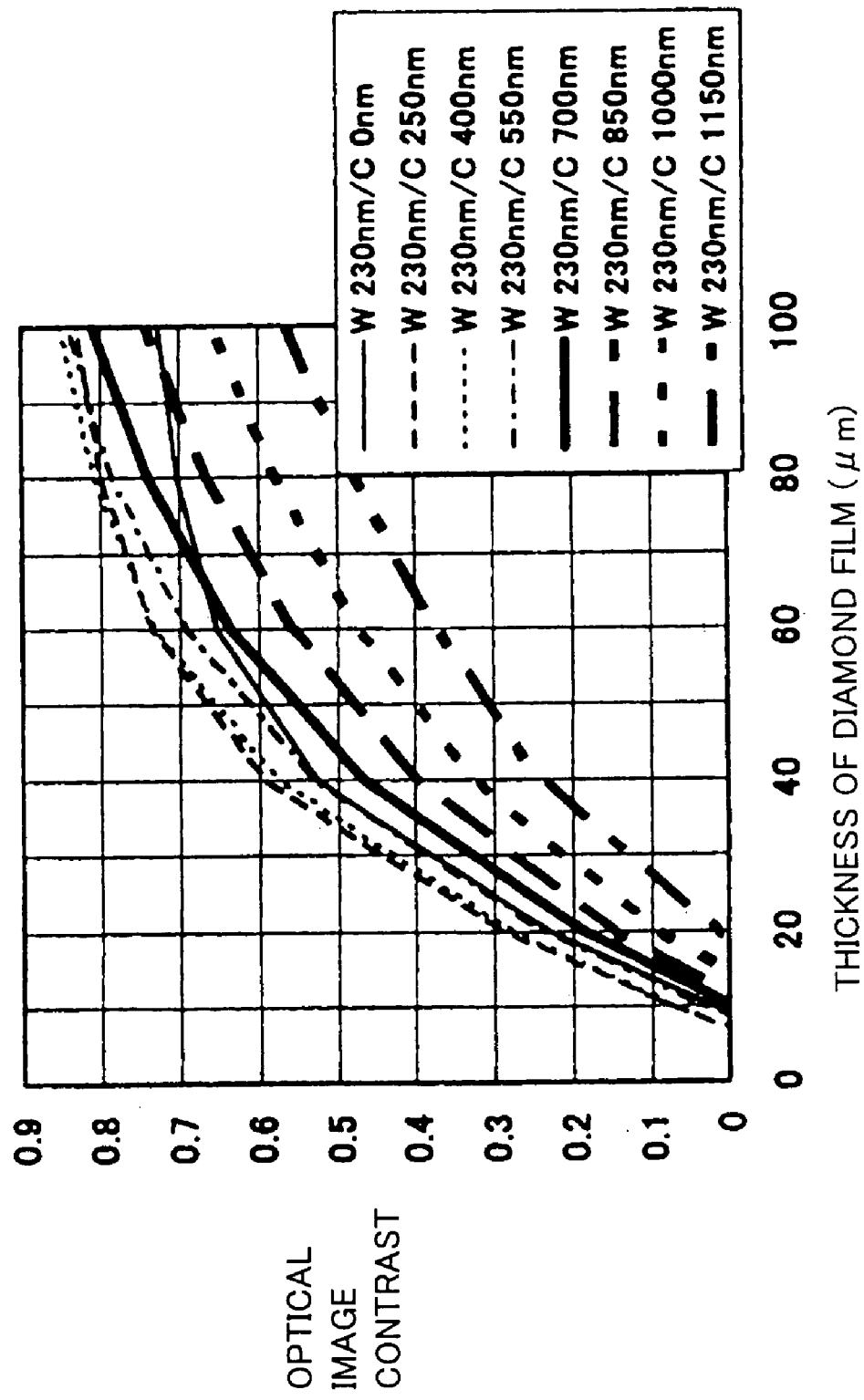
FIG. 6 is a graph showing the relation between thicknesses of diamond layers forming X-ray absorbers and optical image contrast in an X-ray mask according to a first embodiment of the present invention.

FIG. 6 shows results obtained when varying the thicknesses of tungsten layers with reference to the relation between optical image contrast in a case of employing the X-ray mask 1 according to this embodiment and the thickness of the diamond film.

The X-ray mask 1 consists of the X-ray absorbers 2 each having a two-layer structure including a first layer of tungsten having a thickness of 230 nm and a second layer of diamond. FIG. 6 shows optical image contrast in a case of varying the thicknesses of the diamond layers forming the X-ray absorbers 2 in the range of 0 to 1150 nm.

In the comparative X-ray absorber shown in FIG. 5, the optical image contrast varies with the thickness of the tungsten layer and the thickness of the diamond film forming the X-ray transmitter. However, it is understood that the highest optical image contrast is obtained when the thickness of the tungsten layer is 300 nm if the exposure wavelength λ is relatively short and the thickness of the diamond film forming the X-ray transmitter is at least 60 μm.

It is also understood that the X-ray mask 1 according to this embodiment having the X-ray absorbers 2 of the two-layer structure shown in FIG. 6 obtains higher optical image contrast than the X-ray mask having the comparative X-ray absorber shown in FIG. 5 when the thickness of the first layers of tungsten is 230 nm and the thickness of the second layers of diamond is in the range of 250 nm to 550 nm.

In other words, the X-ray mask 1 according to this embodiment obtains higher optical image contrast than the X-ray mask employing the comparative X-ray absorber when the thickness of the diamond film forming the X-ray transmitter is 60 μm to 100 μm and the average exposure wavelength of X-rays absorbed by the resist film is proximate to 0.4 nm.

Table 1 shows a combination of a tungsten layer having a thickness of 229 nm and a carbon layer having a thickness of 547 nm as a two-layer structure exhibiting a phase shift quantity of −0.5π and a transmittance of 50% when the exposure wavelength λ is 0.4 nm.

As compared with a case of performing exposure with a broad exposure spectrum as in the X-ray mask 1 according to this embodiment, however, optical image contrast is rather increased when the thickness of the second layers of diamond is slightly reduced if the average exposure wavelength of X-rays absorbed by the resist film is 0.4 nm.

Employment of such a broad exposure spectrum may result in deviation from an optimum condition assumed in response to the average exposure wavelength of X-rays absorbed by the resist film. Also in this case, higher optical image contrast is obtained also with respect to the broad exposure spectrum when employing two-layer X-ray absorbers as in the X-ray mask 1 according to this embodiment.

Difference between effects of optical image contrast resulting from the sizes of mask patterns is now described. More specifically, optical image contrast values are compared by varying the widths of X-ray absorbers 2 in the range of 15 nm to 55 nm in L & S patterns having pitches of 70 nm.

Figure 7:
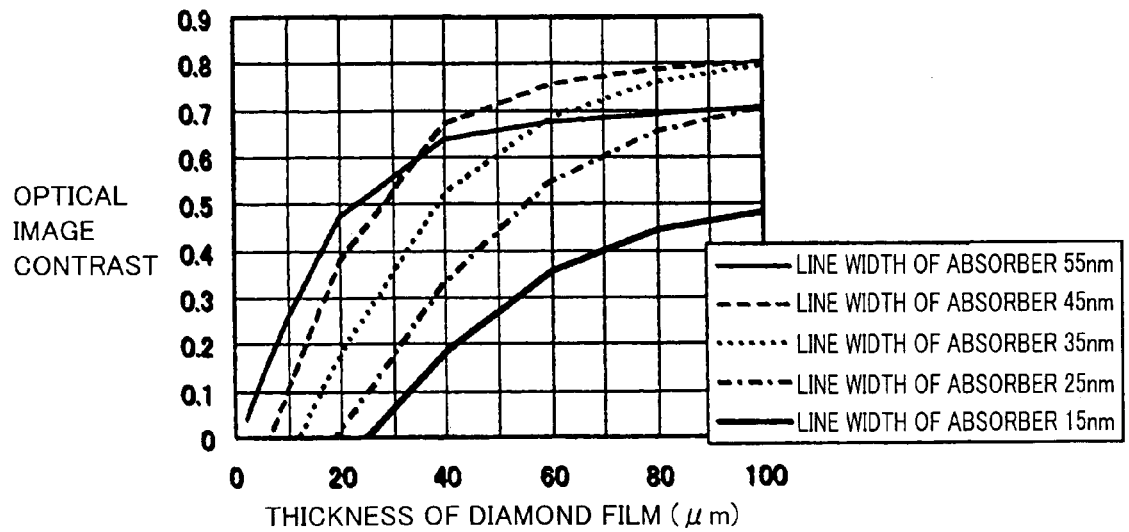
FIG. 7 is a graph showing optical image contrast with reference to various line widths of mask patterns in an X-ray mask having a 35 nm L & S pattern including comparative X-ray absorbers.

FIG. 7 is a graph plotting optical image contrast values in a case of employing a tungsten layer of 300 nm in thickness as a comparative X-ray absorber while varying the thickness of a diamond film forming an X-ray transmitter.

Figure 8:
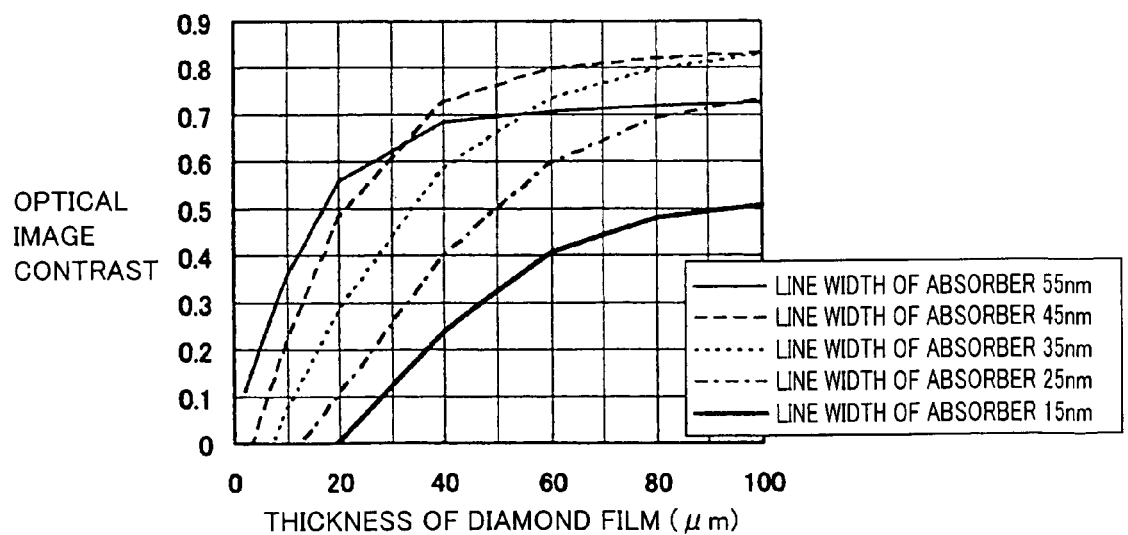
FIG. 8 is a graph showing optical image contrast with reference to various line widths of mask patterns in the X-ray mask according to the first embodiment having a 35 nm L & S pattern.

FIG. 8 is a graph plotting optical image contrast values in a case of employing layers of tungsten and diamond having thicknesses of 230 nm and 250 nm respectively as the X-ray absorbers 2 each having a two-layer structure according to this embodiment while varying the thickness of the diamond film forming the X-ray transmitter.

It is understood from FIG. 7 that the comparative X-ray absorber can improve the optical image contrast by increasing the line width of a mask pattern by about 10 nm to 20 nm. A similar effect is observed also in the X-ray absorbers each having a two-layer structure, as shown in FIG. 8. In other words, optical image contrast can be further improved by increasing the line width of the mask pattern by about 10 nm to 20 nm.

Comparing FIGS. 7 and 8 with each other, it is understood effective to increase the width of an absorber pattern by about 10 nm for improving optical image contrast particularly when the thickness of the diamond layers forming the X-ray absorbers 2 is at least 40 μm.

Figure 9:
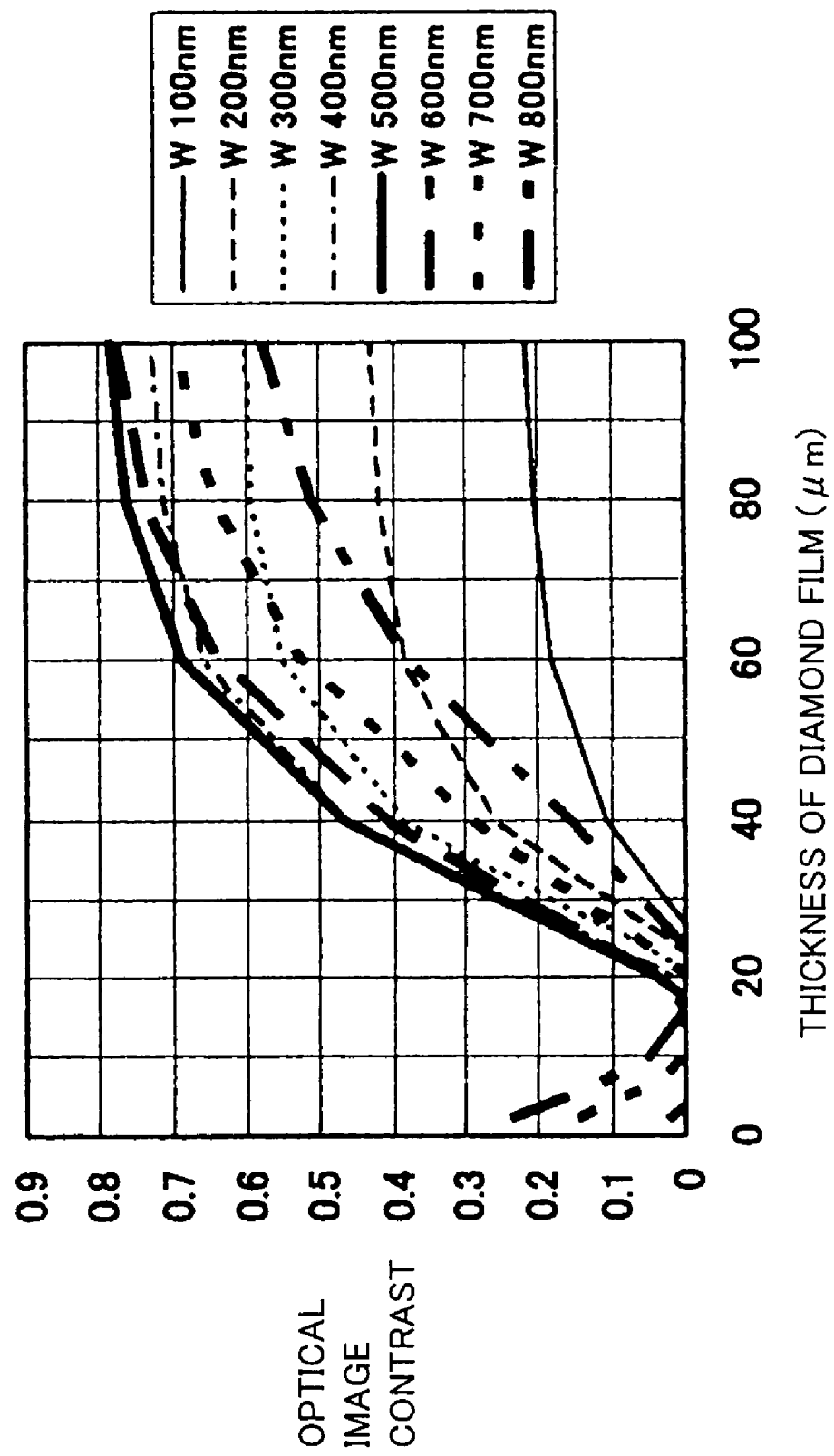
FIG. 9 is a graph showing variations of optical image contrast with reference to various thicknesses of X-ray absorbers and X-ray transmitters in a comparative X-ray mask.

FIG. 9 shows optical image contrast values in a case of further increasing the mask-to-resist interval G to 8 μm. This is a graph plotting the optical image contrast values while varying the thicknesses of the X-ray absorbers 2 and the thickness of the diamond film forming the X-ray transmitter when the line width of the X-ray absorbers 2 of an L & S pattern having a pitch of 70 nm is 55 nm.

Figure 10:
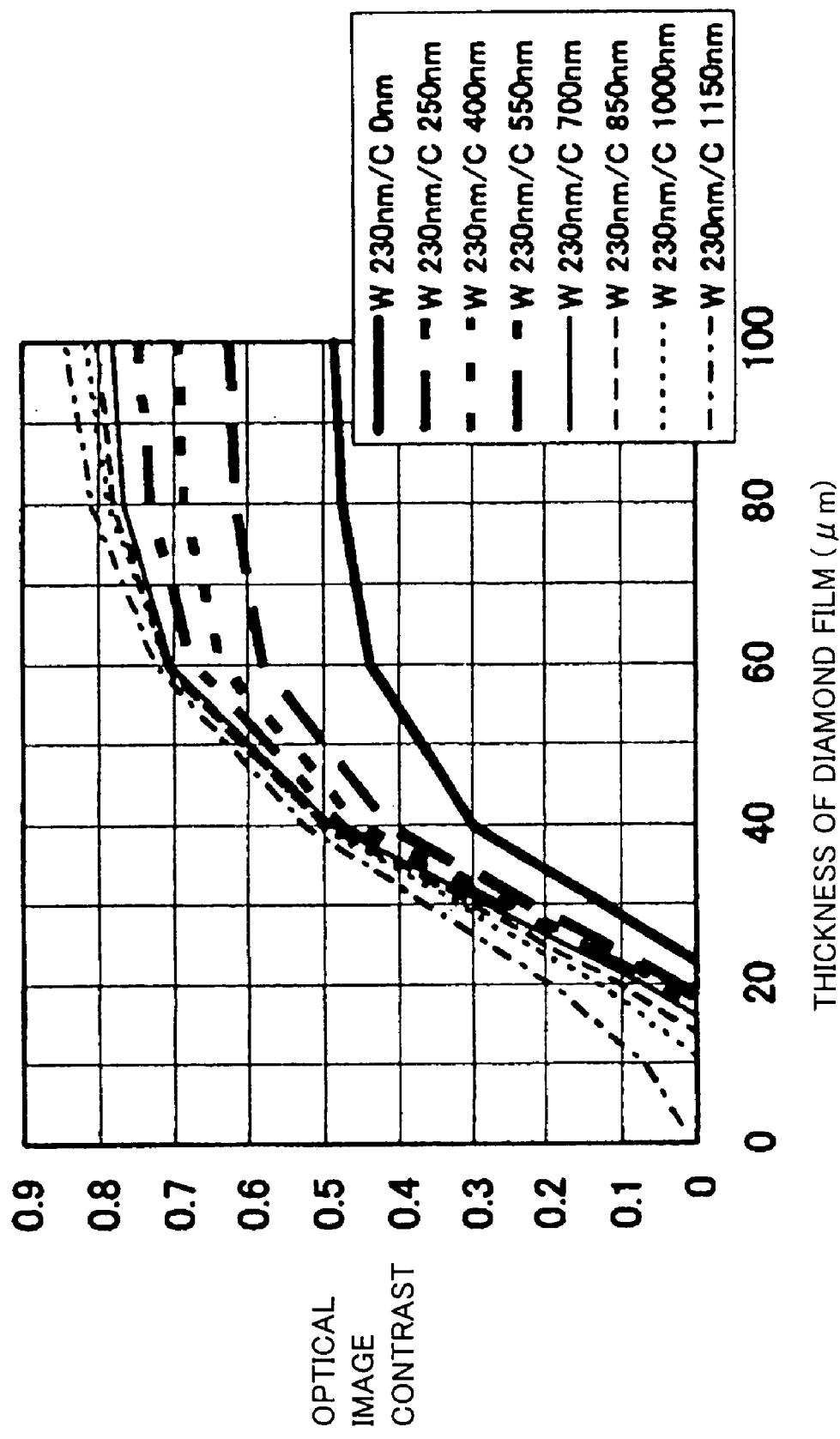
FIG. 10 illustrates variations of optical image contrast with reference to various thicknesses of second X-ray absorbers and an X-ray transmitter in the X-ray mask according to the first embodiment.

FIG. 10 is a graph showing optical image contrast values obtained in an X-ray mask having the same mask-to-resist interval G as that of the X-ray mask shown in FIG. 9 while varying the thickness of second layers of diamond with two-layer X-ray absorbers 2 including first layers of tungsten having a thickness of 230 nm and the second layers of diamond.

The line width of the X-ray absorbers 2 is 55 nm identically to the aforementioned case. In a 35 nm L & S pattern, geometric phase difference is 0.38π rad if the mask-to-resist interval G is 8 μm and the exposure wavelength λ is 0.4 nm. In other words, the geometric phase difference is smaller than the optimum value of 0.5 πrad.

FIG. 9 shows that the optical image contrast is higher in a case of employing tungsten layers of 500 nm in thickness as X-ray absorbers as compared with a case of employing tungsten layers having the optimum thickness of 300 nm for a mask-to-resist interval G of 6 μm when the geometric phase difference deviates from the optimum value.

Thus, it is understood that the optimum condition for X-ray absorbers varies with the mask-to-resist interval G. When the exposure wavelength k is 0.4 nm, the tungsten layers having the thickness of 500 nm exhibit a transmittance of 23% and a phase shift quantity of −0.63π. In other words, it is understood that the transmittance and the optimum phase shift quantity of the X-ray absorbers vary with the mask-to-resist interval G.

It is understood that the difference between the geometric phase difference and the phase shift quantity of the mask satisfies 0.38π−(−0.63π)=1.01π, i.e., the phase condition described with reference to the principle employed in the present invention.

FIG. 10 is a graph showing optical image contrast values obtained by varying the phase shift quantities of X-ray absorbers each having a two-layer structure of tungsten and diamond with a transmittance in the range of 49% to 51% with respect to a mask-to-resist interval G of 8 μm. When X-ray absorbers of a two-layer structure are employed, the phase shift quantity thereof can be changed without substantially changing the transmittance of the X-ray mask.

The line width of the X-ray absorbers is 55 nm, similarly to the aforementioned case. It is understood from Table 1 that the phase shift quantity of the X-ray absorbers is −0.5 πwhen the thickness of diamond layers is 550 nm. It is also understood from Table 1 that the phase shift quantity of the X-ray absorbers is increased toward the minus side when the thickness of the diamond layers is at least 550 nm.

As understood from FIG. 10, optical image contrast values are substantially identical to each other when the thickness of diamond layers forming two-layer X-ray absorbers is 700 nm and the thickness of a tungsten layer forming a single-layer X-ray absorber is 500 nm.

It is also understood that the optical image contrast is increased when the thickness of the diamond layers is further increased and the phase shift quantity of the X-ray absorbers is increased toward the minus side as compared with the case that the thickness of the first tungsten layers of the X-ray absorbers is 500 nm.

In other words, it is understood that an optical image having higher contrast than the prior art is obtained also when the geometric phase difference remarkably deviates from 0.5π, if X-ray absorbers having a two-layer structure are employed and the phase shift quantity as well as the transmittance of the X-ray absorbers are adjusted.

The X-ray mask 1 according to this embodiment is described with reference to an L & S pattern attaining a particularly remarkable effect. Also when employing X-ray absorbers having a hole pattern or a more complex two-dimensional mask pattern, however, a desired resist pattern is formed if at least either the mask-to-resist interval G or the exposure wavelength λ is properly selected. According to this embodiment, adjustment of conditions such as the phase shift quantity and the transmittance, performed in the comparative single-layer X-ray absorber, is performed with the X-ray absorbers having a two-layer structure.

Thus, a semiconductor device having a finer pattern can be formed with an exposure wavelength λ shorter than the conventional one and a mask-to-resist interval G wider than the conventional one. Therefore, it is not impossible to form a hole pattern or a more complex two-dimensional mask pattern.

In other words, a hole pattern or a more complex two-dimensional mask pattern can be formed similarly to that transferable in the comparative X-ray absorber. Further, it is possible to form a semiconductor device having a fine pattern by selecting at least either a proper phase shift quantity or a proper transmittance.

An element such as bromine employed in this embodiment as a resist film having an absorption edge in an exposure waveband, there is such an exposure wave range that the maximum energy of secondary electrons generated in the resist film remains unchanged also when the exposure wavelength λ is reduced. Therefore, such a remarkable effect is attained that influence by the secondary electrons deteriorating the resolution is suppressed.

When the X-ray absorbers 2 according to this embodiment are combined with a resist film having an absorption edge in an exposure wave range, therefore, influence by secondary electrons is suppressed also when the exposure wavelength λ is reduced. Consequently, an optical image having high contrast can be provided. Therefore, it is possible to form a resist film having a more accurate pattern than the comparative example.

Second Embodiment

Figure 12:
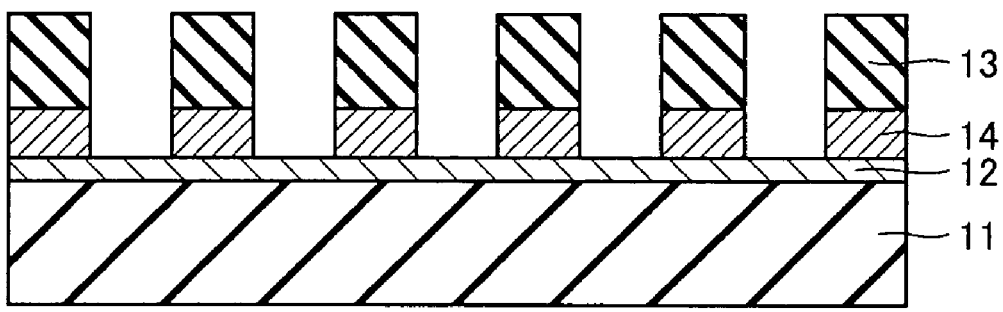
FIG. 12 is a model diagram showing another X-ray mask according to the second embodiment.

An X-ray mask according to a second embodiment of the present invention is now described with reference to FIGS. 11 and 12.

FIG. 11 shows the structure of an X-ray mask formed by X-ray absorbers having a two-layer structure. In the X-ray mask according to this embodiment, a diamond film 11 having a thickness of 5 μm is employed as an X-ray transmitter, and an amorphous chromium oxide film 12 is employed as an etching stopper. Diamond layers 13 serving as first layers are formed on the chromium oxide film 12.

Tungsten layers 14 serving as second layers are formed on the diamond layers 13. The diamond layers 13 and the tungsten layers 14 form the X-ray absorbers of the two-layer structure. The X-ray absorbers of the two-layer structure have a high ratio of a pattern to a line width, i.e., a high aspect ratio.

Therefore, it is difficult to accurately work the X-ray absorbers. According to this embodiment, therefore, the etching stopper is inserted between the diamond film 11 and the diamond layers 13. Thus, the pattern of the X-ray absorbers can be accurately worked.

Figure 16:
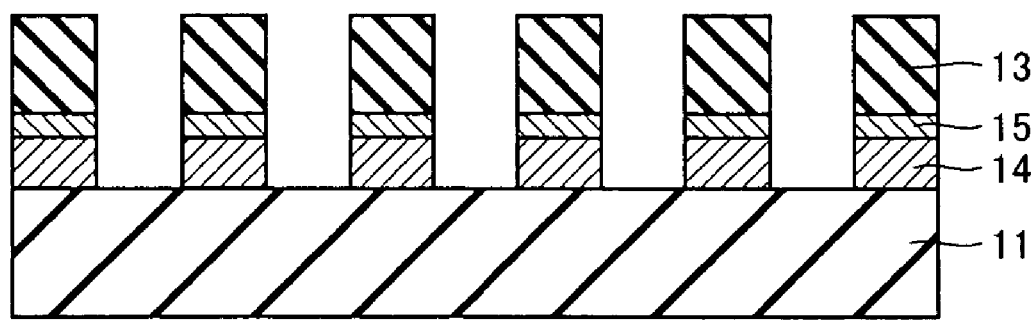
FIG. 16 is a model diagram showing another X-ray mask according to the second embodiment.

If the transmittances and the phase shift quantities are not remarkably different from each other between the first and second layers of the X-ray absorbers, etching stoppers or hard mask material layers 15 for the second or first layers of the X-ray absorbers may be inserted between tungsten layers 14 and diamond layers 13 serving as the first and second layers respectively, as shown in FIG. 16.

Each of the X-ray absorbers is so separated into two layers that optimum etching gas and optimum conditions can be set for the respective layers. For example, tungsten, etched with etching gas mainly composed of fluorine, is hardly etched with etching gas mainly composed of oxygen, On the other hand, diamond, readily etched with oxygen plasma, is not etched with fluorine-based plasma dissimilarly to tungsten. Therefore, accurate pattern working can be implemented by selecting the optimum etching gas for attaining a high etching selection ratio with respect to underlayer films when etching the respective layers.

In the X-ray absorbers according to this embodiment, the diamond layers 13 serving as the first layers are provided under the tungsten layers 14. When the diamond layers 13 serving as the first layers are etched, therefore, the tungsten layers 14 serve as hard masks for the diamond layers 13. Consequently, an accurate pattern for the X-ray absorbers is formed while controlling the shapes of side walls of the diamond layers 13.

The diamond layers 13 serving as the first layers are etched with etching gas mainly composed of oxygen. Therefore, etching stoppers are preferably formed by oxide films containing an oxide such as silicon oxide, tungsten oxide or tantalum oxide, which is hardly etched with oxygen plasma.

Alternatively, the etching stoppers may be formed by nitride films containing a nitride such as silicon nitride, chromium nitride or tungsten nitride, so far as a selection ratio with respect to underlayer films is in excess of a prescribed value.

In the X-ray mask according to this embodiment, the tungsten layers 14 are formed on the diamond layers 13, in consideration of easiness of etching. However, diamond layers 13 may alternatively be provided on tungsten layers 14 as shown in FIG. 12, for attaining an effect of improving optical image contrast similarly to the X-ray absorbers having the tungsten layers 14 provided on the diamond layers 13 as shown in FIG. 11.

Third Embodiment

An X-ray mask according to a third embodiment of the present invention is now described with reference to FIG. 13.

Figure 13:
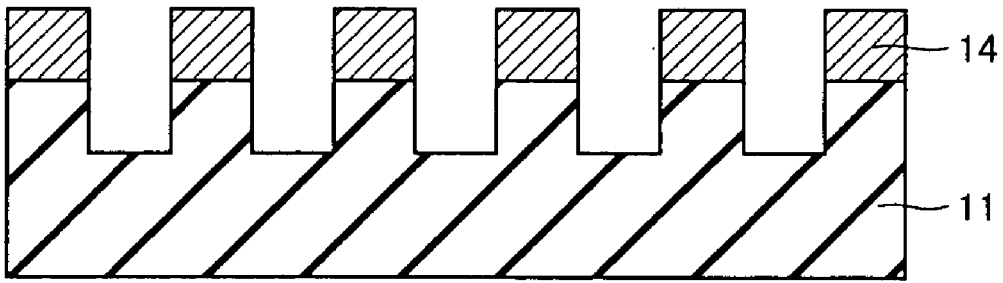
FIG. 13 is a model diagram showing an X-ray mask according to a third embodiment of the present invention.

FIG. 13 is a diagram for illustrating an X-ray mask formed with X-ray absorbers on portions other than trenches dug in a diamond film 11 serving as an X-ray transmitter. In the X-ray mask shown in FIG. 13, the portions other than the dug portions, partially forming the X-ray transmitter, i.e., projections are employed as the X-ray absorbers. Therefore, no layers may be formed as the first layers of the X-ray absorbers. Consequently, steps of film formation and working can be simplified.

In this case, prescribed adjustment is so performed that low membrane stress is caused only in the dug regions of the diamond film 11 serving as the X-ray transmitter. Thus, stress fluctuation is reduced in pattern working of the diamond film 11 serving as the X-ray transmitter. Consequently, the possibility of positional distortion of the X-ray mask is reduced.

Ions are implanted before working the dug regions of the X-ray transmitter. Thus, membrane stress of the X-ray transmitter is so adjusted as to obtain X-ray absorbers of a two-layer structure having a small degree of positional distortion.

Difference between etching rates of portions of the diamond film 11 subjected to ion implantation and portions not subjected to ion implantation is utilized thereby enabling working of an accurate pattern without employing etching stoppers. While boron ions are implanted in this embodiment, phosphorus ions or the like may alternatively be employed.

Fourth Embodiment

An X-ray mask according to a fourth embodiment of the present invention is now described with reference to FIG. 14.

Figure 14:
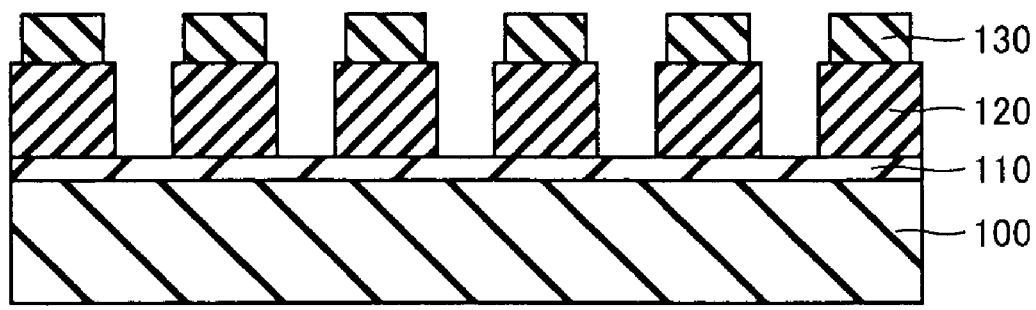
FIG. 14 is a model diagram showing an X-ray mask according to a fourth embodiment of the present invention.

FIG. 14 is a block diagram of an X-ray mask provided with X-ray absorbers each having a two-layer structure consisting of layers having different pattern sizes. In the X-ray mask according to this embodiment, an etching stopper 110 is formed on an X-ray transmitter 100, as shown in FIG. 14.

In this X-ray mask, further, first X-ray absorbers 120 are formed on the etching stopper 110, and second X-ray absorbers 130 are formed on the first X-ray absorbers 120.

Referring to FIG. 14, the pattern size of the second X-ray absorbers 130 is smaller than that of the first X-ray absorbers 120. Optical image contrast can be improved by adjusting the mask pattern size with respect to a periodic pattern having the same pattern pitch, as described with reference to the first embodiment.

When the X-ray mask according to this embodiment is employed, it is possible to adjust the mask pattern size of a layer having a larger absolute value of a phase shift quantity and a lower transmittance among respective layers, for example. Consequently, it is possible to form a pattern having higher optical image contrast than the prior art.

Figure 15:
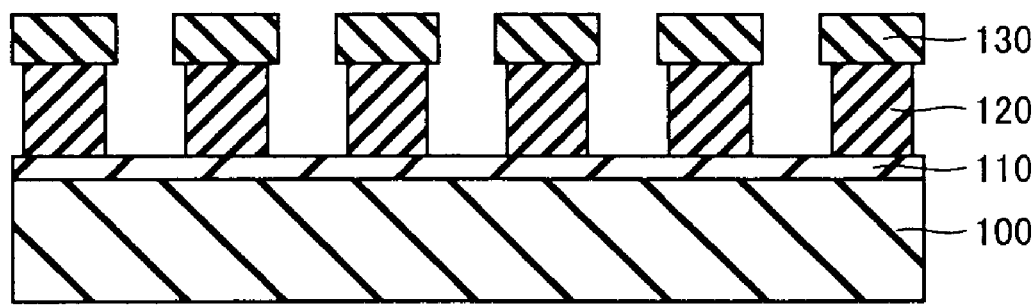
FIG. 15 is a model diagram showing another X-ray mask according to the fourth embodiment.

The X-ray mask shown in FIG. 15 attains an effect of improving optical image contrast also when the second X-ray absorbers 130 have a larger mask pattern size than the first X-ray absorbers 120.

In this case, however, it is difficult to measure the mask pattern size of the first X-ray absorbers 120. Therefore, it is preferable to increase the mask pattern size of the first X-ray absorbers 120 beyond that of the second X-ray absorbers 130, as shown in FIG. 14.

Fifth Embodiment

A method of fabricating a semiconductor device with the inventive X-ray mask according to a fifth embodiment of the present invention is now described.

According to this embodiment, a semiconductor device is fabricated with an exposure method similar to that according to the first embodiment. A diamond film having a thickness of 5 µm is employed as the material for an X-ray transmitter. Tungsten layers having a thickness of 230 nm and density of 16.2 g/cm$^3$ are employed as first X-ray absorbers.

Further, diamond layers having a thickness of 250 nm and density of 3.5 g/cm$^3$ are employed as second X-ray absorbers. The tungsten and diamond layers serving as the first and second X-ray absorbers respectively form X-ray absorbers having a two-layer structure.

In other words, an X-ray mask similar in structure to that shown in FIG. 11 is employed. In the method of fabricating a semiconductor device according to this embodiment, a mask pattern having a period of a pitch of 70 nm formed on the X-ray mask is transferred onto a resist film as a 35 nm L & S pattern.

Radiation emitted from a radiation generator having deflection magnetic field strength of 3.5 T and acceleration energy of 0.585 GeV is employed as exposure light. This radiation is condensed on a beam line through two platinum mirrors having an oblique angle of incidence of 1°.

The condensed light passes through a beryllium window having a thickness of 18 µm serving as a vacuum barrier and a diamond filter having a thickness of 55 µm. A mask-to-resist interval G is 6 µm. The photosensitized resist film has a bromine content of 45 percent by weight, contains novolac bromide as base resin and has a thickness of 0.2 µm. Thus, the pattern of the 35 nm L & S pattern is formed on the resist film.

The pattern on this resist film is etched. Thereafter an underlayer film is worked. Then, the underlayer film is cleaned and formed. The resist film is exposed again with another X-ray mask. The aforementioned steps are so repeated as to fabricate a semiconductor device. X-ray absorbers having a two-layer structure are employed for transferring the pattern of the X-ray mask to the resist film. Thus, a semiconductor device having higher performance than a conventional one can be fabricated with a pattern finer than a conventional one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating an X-ray mask comprising:
    etching an X-ray transmitter at a surface of said X-ray transmitter to form a plurality of recesses extending from the surface and into said X-ray transmitter, leaving portions of the surface between respective parts of recesses; and
    forming a laminated X-ray absorber on said surface of said X-ray transmitter, but not in said recesses, wherein said laminated X-ray absorber includes at least two layers having different compositions, wherein phase shift of X-rays transmitted through said X-ray absorber is in a range of $0.3\pi$ to $0.6\pi$ and transmittance of the X-rays transmitted through said X-ray absorber is in a range of 30% to 60% for X-rays having an average exposure wavelength longer than 0.3 nm and shorter than 0.7 nm.

2. The method of fabricating an X-ray mask according to claim 1, wherein
said laminated X-ray absorber includes a first X-ray absorber opposite said X-ray transmitter and a second X-ray absorber in contact with said first X-ray absorber,
tungsten is employed as one of said first X-ray absorber and said second X-ray absorber, and
diamond is employed as the other of said first X-ray absorber and said second X-ray absorber.

3. The method of fabricating an X-ray mask according to claim 1, wherein
said laminated X-ray absorber includes a first X-ray absorber on said X-ray transmitter and a second X-ray absorber on said first X-ray absorber, and
the method of fabricating an X-ray mask further comprises:
forming an etching stopper film, stopping etching when etching said first X-ray absorber on said X-ray transmitter, and
forming said second X-ray absorber on said etching stopper film.

4. The method of fabricating an X-ray mask according to claim 1, wherein
said laminated X-ray absorber includes a first X-ray absorber opposite said X-ray transmitter and a second X-ray absorber on said first X-ray absorber, and
the method of fabricating an X-ray mask further comprises:
forming an interlayer film as an etching stopper or a hard mask on said first X-ray absorber, and
forming said second X-ray absorber on said interlayer film.

5. The method of fabricating an X-ray mask according to claim 1, wherein said laminated X-ray absorber has a layer containing at least one substance selected from the group consisting of lithium, beryllium, boron, carbon, sodium, magnesium, aluminum, silicon, phosphorus, sulfur, potassium, calcium, scandium, titanium, vanadium, chromium, manganese, iron, cobalt, nickel, copper, zinc, gallium, germanium, arsenic, selenium, palladium, silver, cadmium, indium, tin, antimony, tellurium, cesium, barium, mixtures of these elements, a carbide including silicon carbide and tungsten carbide, a nitride including silicon nitride, aluminum nitride, and chromium nitride, an oxide including silicon oxide and chromium oxide, a fluoride, and an iodide.

6. The method of fabricating an X-ray mask according to claim 1, wherein said laminated X-ray absorber has a layer containing a substance selected from the group consisting of carbon, titanium, vanadium, chromium, manganese, iron, nickel, copper, zinc, gallium, germanium, arsenic, selenium, palladium, silver, cadmium, indium, tin, antimony, and tellurium.

7. The method of fabricating an X-ray mask according to claim 1, further comprising selectively implanting ions into regions of said X-ray transmitter where portions of said X-ray transmitter are to be removed in forming said recesses, before forming said recesses.

8. The method of fabricating an X-ray mask according to claim 1, including forming said laminated X-ray absorber in a periodic pattern.

9. A method of fabricating an X-ray mask comprising:
forming an X-ray transmitter;
forming a first X-ray absorber opposite said X-ray transmitter, said first X-ray absorber including a plurality of spaced apart first X-ray absorber portions, each first X-ray absorber portion having side surfaces substantially transverse to said X-ray transmitter and a first width measured between the side surfaces of said first X-ray absorber portions; and
forming a second X-ray absorber on said first X-ray absorber, said second X-ray absorber comprising a plurality of second X-ray absorber portions spaced from each other, each second X-ray absorber portion being disposed on a corresponding one of the first X-ray absorber portions, each second X-ray absorber portion having side surfaces substantially transverse to said X-ray transmitter and a second width measured between the side surfaces of the second X-ray absorber portions, the second width being larger than the first width and none of the side surfaces of the second X-ray absorber portions being contiguous with the side surfaces of the first X-ray absorber portions.

10. The method of fabricating an X-ray mask according to claim 9, wherein at least one of said first and second X-ray absorbers is selected from the group consisting of lithium, beryllium, boron, carbon, sodium, magnesium, aluminum, silicon, phosphorus, sulfur, potassium, calcium, scandium, titanium, vanadium, chromium, manganese, iron, cobalt, nickel, copper, zinc, gallium, germanium, arsenic, selenium, palladium, silver, cadmium, indium, tin, antimony, tellurium, cesium, barium, mixtures of these elements, a carbide including silicon carbide and tungsten carbide, a nitride including silicon nitride, aluminum nitride, and chromium nitride, an oxide including silicon oxide and chromium oxide, a fluoride, and an iodide.

11. The method of fabricating an X-ray mask according to claim 9, wherein at least one of said first and second X-ray absorbers is selected from the group consisting of carbon, titanium, vanadium, chromium, manganese, iron, nickel, copper, zinc, gallium, germanium, arsenic, selenium, palladium, silver, cadmium, indium, tin, antimony, and tellurium.

12. A method of fabricating a semiconductor device including carrying out an exposure with an X-ray mask having a geometric X-ray phase difference between the phase of X-rays transmitted through an X-ray transmission part of said X-ray mask and the phase of X-rays transmitted through an X-ray absorber of said X-ray mask in a range including $0.5\pi$ and proximity to $0.5\pi$, between a resist film located at a position for forming an optical image with said X-rays and said X-ray mask, wherein
said X-ray mask comprises an X-ray transmitter and said X-ray absorber includes a laminated structure having at least two layers on said X-ray transmitter,
said laminated structure includes at least two layers having different compositions, and
either the phase shift of the X-rays transmitted through said X-ray absorber is in a range of $0.3\pi$ to $0.6\pi$ or the transmittance of the X-rays transmitted through said X-ray absorber is in a range of 30% to 60%.

13. The method of fabricating a semiconductor device according to claim 12, including carrying out the exposure with an average exposure wavelength of the X-rays longer than 0.3 nm and shorter than 0.7 nm.

14. The method of fabricating a semiconductor device according to claim 12, wherein absolute value of difference between the geometric phase difference and the phase shift quantity is in a range including $\pi$ and proximity to $\pi$.

15. A method of fabricating an X-ray mask comprising:
forming an X-ray transmitter;
forming a first X-ray absorber opposite said X-ray transmitter, said first X-ray absorber including a plurality of spaced apart first X-ray absorber portions, each first X-ray absorber portion having a first width; and forming a second X-ray absorber on said first X-ray absorber, said second X-ray absorber comprising a plurality of second X-ray absorber portions spaced from each other, each second X-ray absorber portion being disposed on a corresponding one of the first X-ray absorber portions, each second X-ray absorber portion having a second width, larger than the first width, wherein tungsten is employed as one of said first and second X-ray absorbers, and diamond is employed as the other of said first and second X-ray absorbers.

16. A method of fabricating an X-ray mask comprising:

forming an X-ray transmitter;

forming a first X-ray absorber opposite said X-ray transmitter;

forming an etching stopper film, stopping etching when etching said first X-ray absorber on said X-ray transmitter, said first X-ray absorber including a plurality of spaced apart first X-ray absorber portions, each first X-ray absorber portion having a first width; and forming a second X-ray absorber on said etching stopper film on said first X-ray absorber, said second X-ray absorber comprising a plurality of second X-ray absorber portions spaced from each other, each second X-ray absorber portion being disposed on a corresponding one of the first X-ray absorber portions, each second X-ray absorber portion having a second width, larger than the first width.

17. A method of fabricating an X-ray mask comprising:

forming an X-ray transmitter;

forming a first X-ray absorber opposite said X-ray transmitter;

forming an interlayer film as an etching stopper or a hard mask on said first X-ray absorber, said first X-ray absorber including a plurality of spaced apart first X-ray absorber portions, each first X-ray absorber portion having a first width; and forming a second X-ray absorber on said interlayer film on said first X-ray absorber, said second X-ray absorber comprising a plurality of second X-ray absorber portions spaced from each other, each second X-ray absorber portion being disposed on a corresponding one of the first X-ray absorber portions, each second X-ray absorber portion having a second width, larger than the first width.

18. A method of fabricating an X-ray mask comprising:

forming an X-ray transmitter;

forming a first X-ray absorber of a first X-ray absorbing material opposite said X-ray transmitter, said first X-ray absorber including a plurality of spaced apart first X-ray absorber portions, each first X-ray absorber portion having a first width; and forming a second X-ray absorber of a second X-ray absorbing material, different from said first X-ray absorbing material, on said first X-ray absorber, said second X-ray absorber comprising a plurality of second X-ray absorber portions spaced from each other, each second X-ray absorber portion being disposed on a corresponding one of the first X-ray absorber portions, each second X-ray absorber portion having a second width, larger than the first width.

* * * * *